(12) United States Patent
Camilleri et al.

(10) Patent No.: US 7,669,163 B1
(45) Date of Patent: Feb. 23, 2010

(54) PARTIAL CONFIGURATION OF A PROGRAMMABLE GATE ARRAY USING A BUS MACRO AND COUPLING THE THIRD DESIGN

(75) Inventors: Nicolas John Camilleri, Santa Cruz, CA (US); Edward S. McGettigan, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 450 days.

(21) Appl. No.: 11/338,360

(22) Filed: Jan. 24, 2006

Related U.S. Application Data

(62) Division of application No. 10/192,311, filed on Jul. 9, 2002, now Pat. No. 7,024,651, which is a division of application No. 09/844,892, filed on Apr. 26, 2001, now Pat. No. 6,462,579.

(51) Int. Cl.
*G06F 17/50* (2006.01)

(52) U.S. Cl. .............................. 716/17; 716/2; 716/11; 716/12; 716/19

(58) Field of Classification Search ..................... 716/2, 716/11, 12, 17, 19
See application file for complete search history.

(56) References Cited

U.S. PATENT DOCUMENTS

| | | | |
|---|---|---|---|
| 5,453,706 A | 9/1995 | Yee | |
| 5,612,891 A | 3/1997 | Butts et al. | |
| 5,734,581 A | 3/1998 | Butts et al. | |
| 5,801,547 A | 9/1998 | Kean | |
| 5,831,448 A * | 11/1998 | Kean | ............ 326/41 |
| 6,020,758 A | 2/2000 | Patel et al. | |
| 6,023,421 A | 2/2000 | Clinton et al. | |
| 6,204,689 B1 * | 3/2001 | Percey et al. | ............ 326/41 |
| 6,211,697 B1 | 4/2001 | Lien et al. | |
| 6,262,596 B1 | 7/2001 | Schultz et al. | |
| 6,462,579 B1 | 10/2002 | Camilleri et al. | |

(Continued)

OTHER PUBLICATIONS

Xilinx's Application Note: Virtex Series; XAPP151 (v1.5), "Virtex Series Configuration Architecture User Guide" Sep. 27, 2000; pp. 1-45; available from Xilinx, Inc. 2100 Logic Drive, San Jose, California 95124.

(Continued)

*Primary Examiner*—Thuan Do
(74) *Attorney, Agent, or Firm*—William E. Zitelli; Lois D. Cartier; LeRoy D. Maunu

(57) ABSTRACT

A method of partially reconfiguring a field programmable gate array (FPGA) with at least one design that has interdesign routing with at least one other design programmed into the FPGA. A first configuration data set implements a first design in a first area of the FPGA, a second design in a second, non-overlapping area, and at least one bus macro that defines a bus interface between the first design and the second design. The bus interface includes a set of signal lines coupled to the first and second designs and logic that controls input and output of signals over the signal lines. A second configuration data set implements a modified version of the first design in the first area and does not implement any version of the second design. The FPGA is configured with the first configuration data set, and then partially configured with the second configuration data set.

6 Claims, 5 Drawing Sheets

U.S. PATENT DOCUMENTS

| | | | |
|---|---|---|---|
| 6,651,225 B1 * | 11/2003 | Lin et al. | 716/4 |
| 6,754,763 B2 * | 6/2004 | Lin | 710/317 |
| 6,798,239 B2 | 9/2004 | Douglass et al. | |
| 7,024,651 B1 | 4/2006 | Camilleri et al. | |
| 7,058,919 B1 | 6/2006 | Young et al. | |
| 7,086,025 B1 | 8/2006 | Yang | |
| 7,292,063 B2 | 11/2007 | Savage et al. | |
| 7,337,422 B1 | 2/2008 | Becker et al. | |
| 7,478,357 B1 | 1/2009 | Mason et al. | |
| 7,539,848 B1 | 5/2009 | Douglass et al. | |

OTHER PUBLICATIONS

Xilinx's Application Note; XAPP153 (v1.0), "Status and Control Semaphore Registers Using Partial Reconfiguration"; Jun. 7, 1999; pp. 1-4; available from Xilinx, Inc. 2100 Logic Drive, San Jose, California 95124.

U.S. Appl. No. 12/180,323, filed Jul. 25, 2008, Mason et al.

Xilinx, Inc., *Virtex-4 User Guide,* Mar. 21, 2006, pp. 163-185, UG070 (v1.5), available from Xilinx, Inc., San Jose, California, USA.

* cited by examiner

PARTIAL CONFIGURATION OF A PROGRAMMABLE GATE ARRAY USING A BUS MACRO AND COUPLING THE THIRD DESIGN

FIELD OF THE INVENTION

The present invention is directed to the partial reconfiguration of programmable gate arrays, in general, and more particularly, to a bus macro and a method of partially reconfiguring a programmable gate array having a plurality of circuit designs which communicate among each other through routing between their separate and independent areas of the array using a bus macro.

BACKGROUND OF THE INVENTION

In the past, field programmable gate array (FPGA) architectures accommodated only configuration of the entire array. Accordingly, with each change in a design and/or the addition of a design, a whole new bit stream had to be generated for configuring or programming the whole FPGA. Recently, however, new FPGA architectures were developed, like the Virtex® series manufactured by Xilinx®, for example, that accommodated a partial reconfiguration even down to an information frame level. For a more detailed understanding of configuration and partial configuration of FPGAs reference is made to two Xilinx® application notes—(1) "Virtex Series Configuration Architecture User Guide", XAPP151 (v1.5), Sep. 27, 2000, and (2) "Status and Control Semaphore Registers Using Partial Reconfiguration", by Nick Camilleri, XAPP153 (v1.0), Jun. 7, 1999 which are incorporated by reference herein in their entirety.

With the new architectures, bit streams may be generated piecemeal for configuring portions of an FPGA with a plurality of different designs. But, obstacles remain in connection with fully implementing partial reconfiguration for all cases. Currently, only simple designs may take advantage of partial reconfiguration, like, for example, a design that has the same routing configuration and look up table (LUT)/flip flop (FF) usage as the designs already configured within the FPGA or a design that does not include interdesign routing, i.e. routing across the virtual borders between separate design areas of the array. Accordingly, one obstacle to overcome is how to handle the partial reconfiguration of designs with different interdesign routing configurations.

In the Xilinx® series of Virtex FPGAs, the routing configuration which controls the routing throughout a design and across the virtual boundary to another design is embedded within each design. More specifically, FIG. 1 illustrates the programming structure of the architecture of an FPGA, like the Virtex series, for example. In this programming structure example, the FPGA includes a plurality of columns, with each column divided into a number of frames. Each frame is essentially 1 bit wide by N bits long and extends the full length of a column. A "shadow register" within each column having the same capacity as a frame of the column accepts data loaded into the FPGA destined for one of the frames of the particular column and temporarily buffers the data until it may load it into the designated frame without interrupting substantially operation of the FPGA. In FIG. 1, each column area is distinct and separate from the other column areas. For example, input/output block (IOB) frames of a column are programmed to control input/output routing and configuration, but do not involve configuration logic block (CLB) frames or block random access memory (BRAM) frames. Likewise, BRAM frames are programmed with data and routing configuration that do not involve CLB and IOB frames.

The CLB frames contain programmed design information within that particular column of an M×N FPGA, where M and N are the number of rows and columns of CLBs within the FPGA, respectively. With the current programming structure of FPGAs, it is a rather complex and difficult operation to program partially a separate and independent area of CLB columns for a particular design which includes interdesign routing. Each design that is routed for a particular area of CLB columns does not know how the other designs of the CLB columns were routed. So, if communication to another design is attempted through partial reconfiguration of a particular design area, the routing will vary and may not connect correctly with existing interdesign routing. Accordingly, for partial reconfiguration, there is a problem that arises when multiple designs are programmed into an FPGA with different interdesign routing structures as will be explained in greater detail herebelow.

A simple example of an FPGA that is to be configured with two designs A and B split into two areas that are separate and isolated from each other is shown in FIG. 2. Designs A and B have interdesign routing. Referring to FIG. 2, the left side columns of the FPGA may be programmed with a design A which may have multiple representations and variants referred to as A1, A2 . . . A(N). Similarly, the right side columns of the FPGA may be programmed with a design B which may also have multiple representations and variants referred to as B1, B2, . . . , B(N). Currently, in order to accommodate the interdesign routing between the A and B designs, designs A and B are combined together into one top level comprehensive design using Verilog programming language, for example, and compiled together to render a combined bit stream for configuring the FPGA. Accordingly, with each change to a different version of design A or design B or both designs, a new combined design would have to be programmed into a comprehensive Verilog design which is then compiled for configuring the FPGA. Thus, a large number of combined design permutations of designs A and B would be needed to satisfy all of the possible variants of each design.

It is preferred that only one design for A and one design for B be loaded at a time by partial reconfiguration of the FPGA. In this manner, with each variant of a design, either A or B or both, the FPGA may be reprogrammed with one design at a time by partial reconfiguration without affecting the programmed area of the other design. In addition, the area of the FPGA being partially reconfigured with the new design variant may be reduced in size and the FPGA may continue to operate throughout the reconfiguration process. Moreover, only the number of design variants of each design may be libraried for configuring the FPGA. However, except for special cases as explained herein above, partial reconfiguration presents problems for designs with interdesign routing. For example, if a new design variant A2 is loaded into the FPGA by partial reconfiguration, it over-writes the previous design variant A1 that was stored in the columns of the left hand side thereof, thus possibly causing a routing disconnect between designs A and B. The same procedure may be performed for the variants of design B in the right hand columns with the same problem possible. It is desired to have the FPGA partially reconfigured in such a way to permit loading of designs A and B independent of one another without disturbing the routing therebetween. In practice, partially reconfiguring the FPGA in this manner is not easily achievable due primarily to the software limitations accommodating programming of the frames of the interdesign routing as mentioned above.

The present invention overcomes the drawbacks described herein above regarding the current architecture of FPGAs and permits partial reconfiguration of an FPGA with multiple designs having interdesign routing configurations.

SUMMARY OF THE INVENTION

In accordance with one aspect of the present invention, a bus macro for use as a routing resource for partial reconfiguration of a field programmable gate array (FPGA) with a design that has interdesign routing with at least one other design programmed into the FPGA comprises: at least one row of bus lines disposed within the FPGA between at least two design areas; a first set of gates disposed within the FPGA for controlling a routing of signals over the at least one row of bus lines from a first design area to a second design area of the FPGA according to a first routing configuration embedded in the first design area; and a second set of gates disposed within the FPGA for controlling a routing of signals over the at least one row of bus lines from the second design area to the first design area of the FPGA according to a second routing configuration embedded in the second design area.

In accordance with another aspect of the present invention, a method of partially reconfiguring a field programmable gate array (FPGA) with at least one design that has interdesign routing with at least one other design programmed into the FPGA comprises the steps of: designating at least one row of bus lines as a routing resource between at least two design areas of the FPGA; creating a first routing configuration for a first design for controlling a routing of signals over the designated at least one row of bus lines from the first design area to a second design area of the FPGA, the first design including the first routing configuration; creating a second routing configuration for a second design for controlling a routing of signals over the designated at least one row of bus lines from the second design area to the first design area of the FPGA, the second design including the second routing configuration; and partially reconfiguring the first and second design areas of the FPGA with the first and second designs, respectively, using the first and second routing configurations thereof.

DETAILED DESCRIPTION OF THE DRAWINGS

Generally, FPGAs include TBUF bus lines which extend transverse or horizontal to and across the vertically structured frames of CLB columns. One row of a TBUF bus may include four bidirectional lines 10, 12, 14, and 16 as shown in the circuit diagram of FIG. 3, for example. In the present embodiment, a hard bus macro 18 is created from the TBUF bus lines 10, 12, 14, and 16 to provide bidirectional communication horizontally between different designs of the FPGA. The bus macro may be locked to the same placement on the FPGA and the left and right TBUF outputs, LOUT and ROUT, respectively, are pre-routed and locked for each instantiation. A set of gates 20, 22, 24, and 26 controls the bus lines 10, 12, 14, and 16, respectively, for interdesign routing of signals from a design to the left of the bus macro 18 to a design to the right of the bus macro. This left to right routing of signals is controlled by input signals LR[3:0] which are connected to the inputs of gates 20, 22, 24, and 26, respectively, and tri-state or enable signals LTRI[3:0] which are connected to the enable inputs of the gates 20, 22, 24, and 26, respectively. Likewise, a set of gates 30, 32, 34 and 36 controls the bus lines 10, 12, 14, and 16, respectively, for interdesign routing of signals from the design to the right of the bus macro 18 to the design to the left of the bus macro 18. This right to left routing of signals is controlled by input signals RL[3:0] which are connected to the inputs of gates 30, 32, 34, and 36, respectively, and tri-state or enable signals RTRI[3:0] which are connected to the enable inputs of the gates 30, 32, 34 and 36, respectively.

Figure 1:
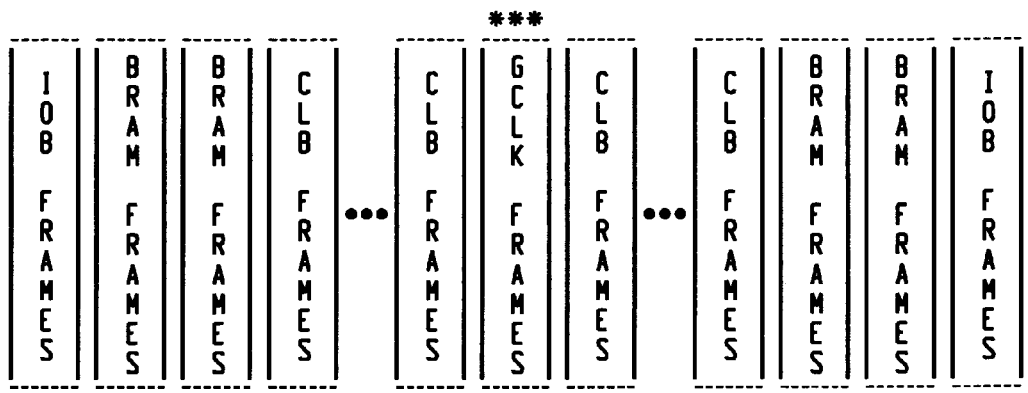
FIG. 1 is an illustration of the programming structure of an architecture of an FPGA suitable for use in embodying the present invention.
Figure 2:
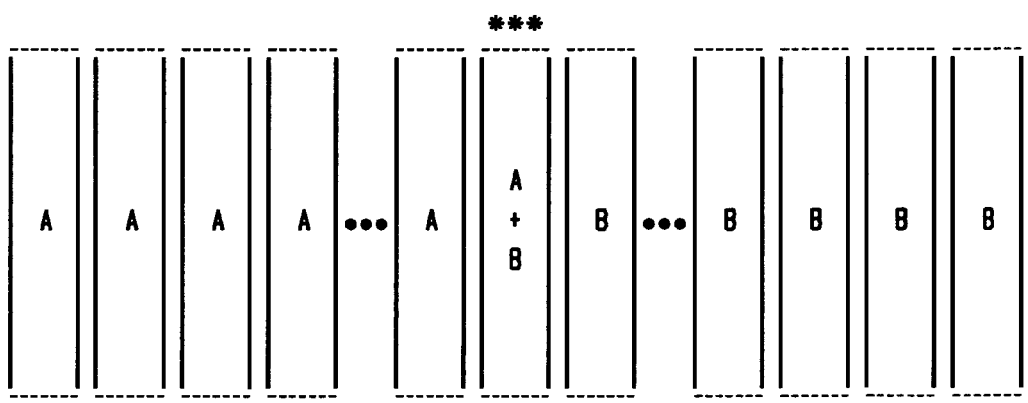
FIG. 2 is an illustration of the FPGA embodiment of FIG. 1 partially reconfigured with two designs into areas that are separated and isolated from each other.
Figure 3:
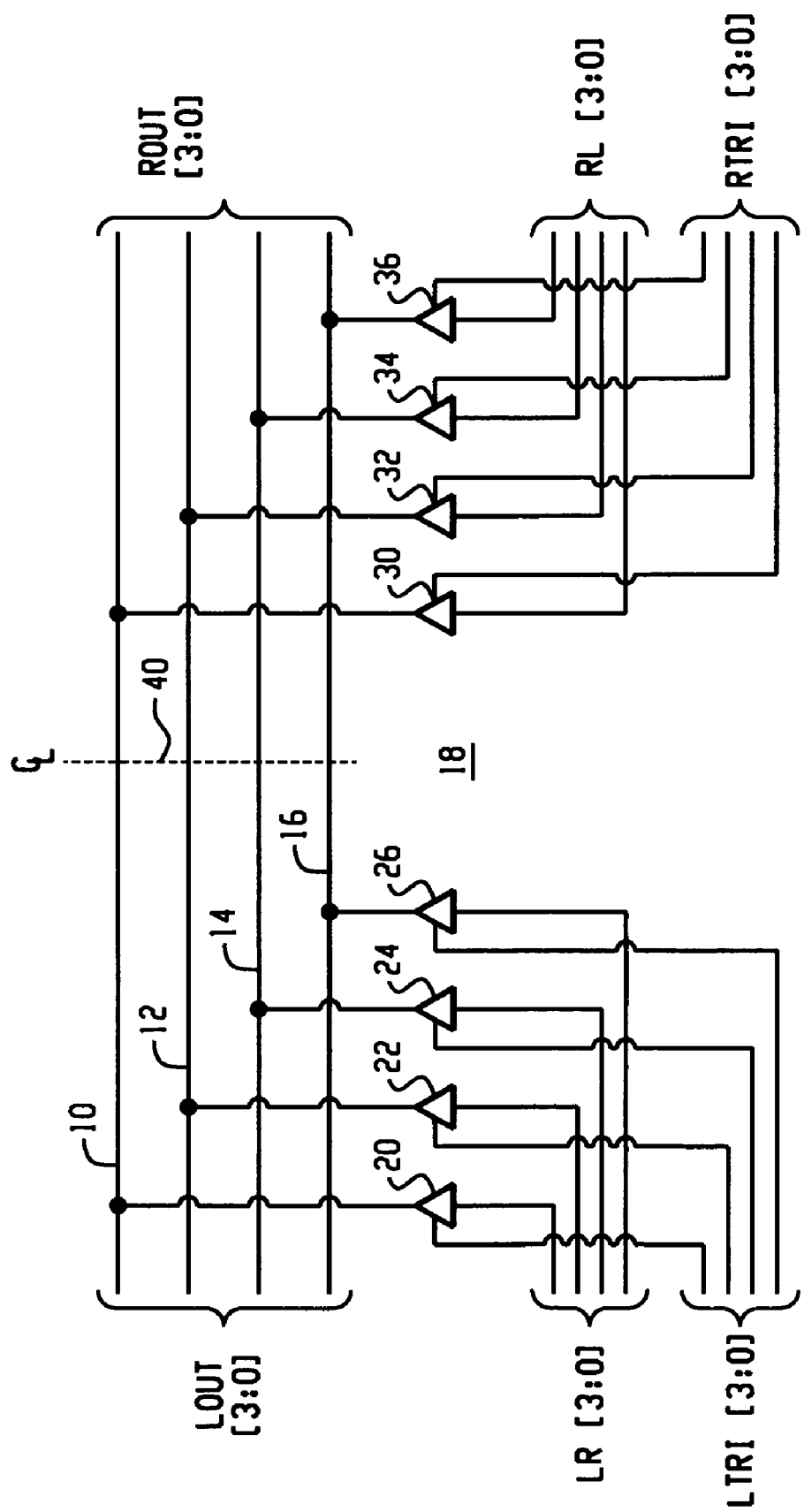
FIG. 3 is a circuit diagram exemplifying a bus macro suitable for embodying one aspect of the present invention.

Accordingly, using the bus macro embodiment of FIG. 3, the routing from left to right and right to left is controlled by the input/tri-state (I/T) signals of the gates which are set and performed when each design (i.e., to the right or to the left) is run to permit the routing to be flexible. When any new or variant design is loaded by partial reconfiguration into the FPGA, it will include the bus macro placement and input/output routing connections for that design embedded therein. The key to the present embodiment, is having a "bridge", such as the TBUF hard bus macro 18, for example, between the left and right side designs that is fixed.

In operation, when signals are to be routed from the left side design to the right side design, the left side design is programmed with an interdesign routing connection for selecting unidirectional paths of bus lines 10, 12, 14 and 16 that are controlled by corresponding gates of the gates 20, 22, 24 and 26. The corresponding gates are enabled by corresponding signals within LTRI[3:0] to pass the corresponding signals of LR[3:0] input to the corresponding gates over the selected paths. For example, suppose bus lines 10 and 12 are the selected unidirectional paths to route signals from the left side design to the right side design, then gates 20 and 22 are enabled by corresponding signals of LTRI [3:0] to pass the corresponding input signals of LR [3:0] over bus lines 10 and 12 to the right side design. The right side design would be programmed with an interdesign routing connection to route the bus lines 10 and 12 at ROUT to their intended destinations within the right side design, thus completing the intended routing transmission from the left side design to the right side design.

Likewise, when signals are to be routed from the right side design to the left side design, the right side design is programmed with an interdesign routing connection for selecting unidirectional paths of bus lines 10, 12, 14 and 16 that are controlled by corresponding gates of the gates 30, 32, 34 and 36. The corresponding gates are enabled by corresponding signals within RTRI[3:0] to pass the corresponding signals of RL[3:0] input to the corresponding gates over the selected paths. For example, suppose bus lines 14 and 16 are the selected unidirectional paths to route signals from the right side design to the left side design, then gates 34 and 36 are enabled by corresponding signals of RTRI [3:0] to pass the corresponding input signals of RL [3:0] over bus lines 14 and 16 to the left side design. The left side design would be programmed with an interdesign routing connection to route the bus lines 14 and 16 at LOUT to their intended destinations within the left side design, thus completing the intended routing transmission from the right side design to the left side design.

In the above example, two of the bus lines 10 and 12 were selected to route signals unidirectionally from left to right and two of the bus lines 14 and 16 were selected to route signals unidirectionally in the opposite direction. But, it is understood that any number of bus lines may be selected for left to right transmissions and vice versa to accommodate the interdesign routing of the two designs. It is further understood that while the TBUF bus embodiment of FIG. 3 is limited to just four interdesign routing signals, it may be expanded to include as many interdesign routing signals as are needed between designs by adding one or more TBUF bus rows to the TBUF bus macro. If between 5 and 8 signals are needed, one additional TBUF bus row may be added, and if between 9 and 12 routing signals are needed, then two TBUF bus rows may be added and so on. It is even possible should the need arise to use one or more of the bus lines of a TBUF row for bidirestional routing operation through proper interconnect routing programming in each design. Accordingly, the TBUF hard bus macro 18 provides a fixed medium which may be used for accommodating interdesign routing between designs which are loaded into separate and independent areas of the FPGA by partial reconfiguration.

Figure 4:
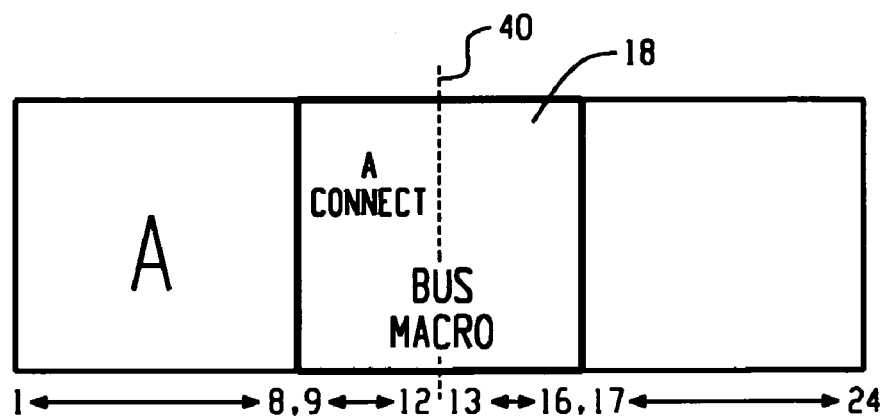
FIG. 4 is an illustration of an FPGA embodiment partially reconfigured with a first design on one side thereof utilizing the bus macro embodiment of FIG. 3.

More specifically, suppose the TBUF hard bus macro 18 with as many bus rows as are needed is centered substantially between the left and right side designs using the center line 40 as a reference and that frames of the columns 9-12 accommodate the programming of the interdesign routing connections of the left side design and the frames of the columns 13-16 accommodate the programming of the interdesign routing connections of the right side design, then, a design A.v may be loaded by partial reconfiguration into the left side CLB columns 1-12 of the FPGA as shown in the illustration of FIG. 4. As explained herein above, the A.v design will have embedded therein the programming of the interdesign routing connections ("A connect") using the bus macro configuration 18 for routing interdesign signals with a right side design. At the Verilog design level, the embedded A connect configuration of the interdesign routing of the A.v design may be programmed using the bus macro 18 for placement into the CLB columns 9-12 of the FPGA and the A.v design programmed for placement in the CLB columns 1-12. Thus, after compilation of the Verilog level A.v design, the resulting bit stream will program the FPGA as shown by the illustration of FIG. 4. An example of an Verilog level design A.v having an embedded interdesign routing configuration utilizing the TBUF hard bus macro 18 is provided in Appendix I.

Figure 5:
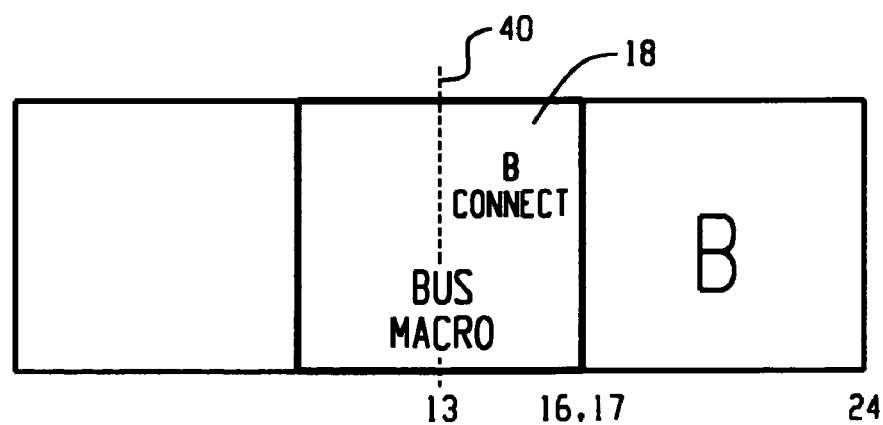
FIG. 5 is an illustration of an FPGA embodiment partially reconfigured with a second design on the other side thereof utilizing the bus macro embodiment of FIG. 3.

Similarly, a design B.v may be loaded by partial reconfiguration into the right side CLB columns 13-24 of the FPGA as shown in the illustration of FIG. 5. As explained herein above, the B.v design will have embedded therein the programming of the interdesign routing connections ("B connect") using the bus macro configuration 18 for routing interdesign signals with the left side A.v design. At the Verilog design level, the embedded B connect configuration of the interdesign routing of the B.v design may be programmed using the bus macro 18 for placement into the CLB columns 13-16 of the FPGA and the B.v design programmed for placement in the CLB columns 13-24. Thus, after compilation of the Verilog level B.v design, the resulting bit stream will program the FPGA as shown by the illustration of FIG. 5. An example of an Verilog level design B.v having an embedded interdesign routing configuration utilizing the TBUF hard bus macro 18 is provided in Appendix II.

Figure 6:
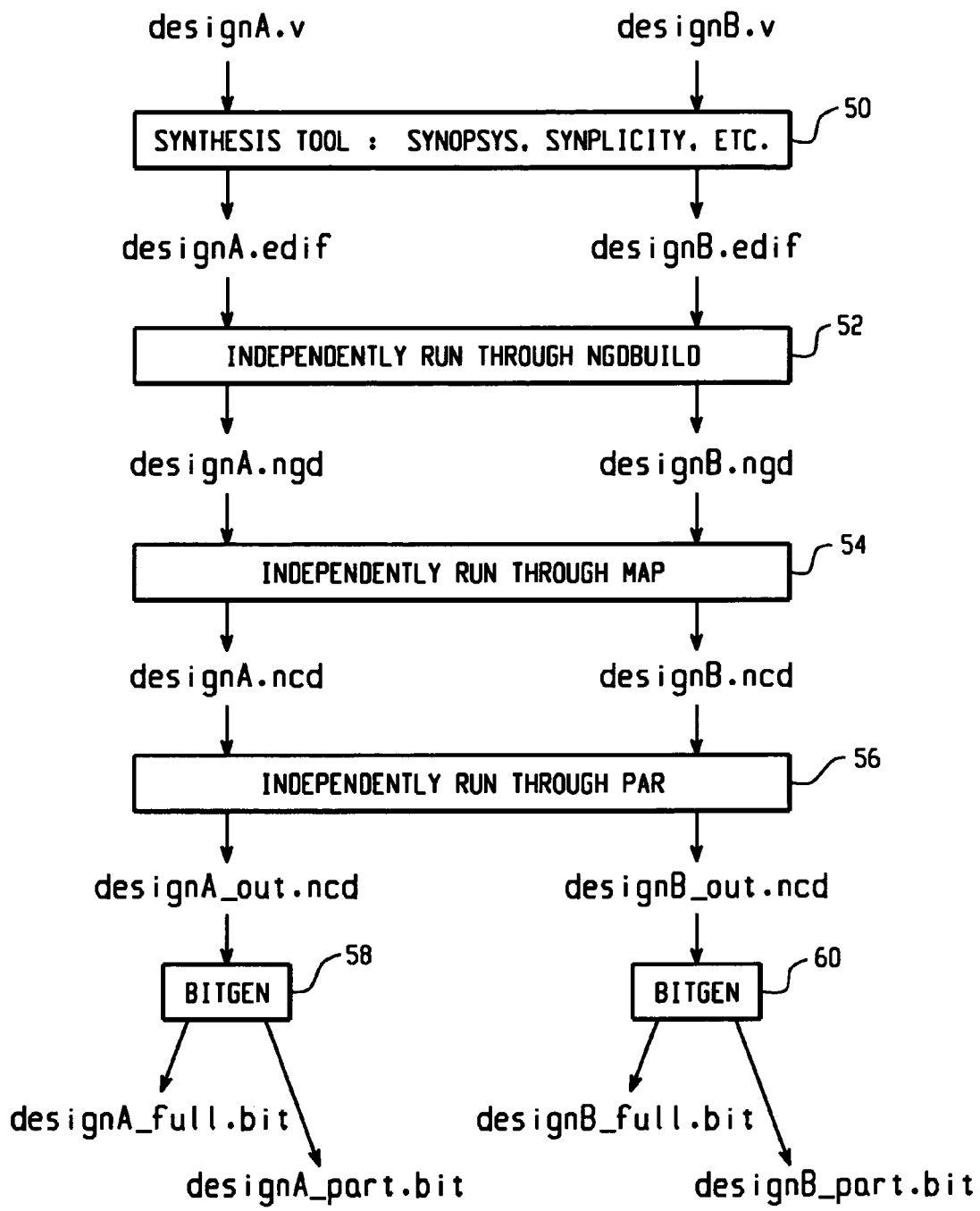
FIG. 6 is a flow diagram exemplifying the compilation processing of top level designs for configuring an FPGA.

FIG. 6 is a flow chart illustrating the software processing of the programs of the partial reconfiguration designs A.v and B.v. While the diagram of FIG. 6 illustrates the processing of the two programs together, it is understood that this is done merely for the purposes of convenience and that the programs are actually processed independently, i.e. either program A.v or B.v may be processed independent of the other. Referring to FIG. 6, if the program of design A.v is to be processed, it may be first synthesized in step 50 by a conventional Synthesis Tool which may include Synopsys, or Synplicity, . . . , etc. type programs to create a new file "A.edif" plus certain constraint files that limit the design to their allowed column areas within the FPGA. The new file "A.edif" plus constraint files are run through an NGDBUILD program in step 52 to create a file "A.ngd" plus additional pin locking constraint files which are then mapped in step 54 through a MAP program to create an "A.ncd" file. The A.ncd file is placed and routed (PAR) in step 56 through a conventional PAR program which will prevent routing of design A.v across the center boundary 40 of the FPGA and limit the programming to columns 1-12 of the left hand side. Step 56 also limits the A connect routing configuration of design A.v to columns 9-12. The PAR processing yields the file "A_out.ncd" which is first passed through a Bitgen program 58 with options set to create a full configuration bit stream file denoted as "A_full.bit" which may be used to program the FPGA. The A_out.ncd file may be passed through the Bitgen program 58 a second time with other options thereof set to create a bit stream file denoted as "A_part.bit" for a partial reconfiguration of the FPGA for design A.v. In the present embodiment, the A_part.bit file will include the A connect column programming information of the A.v design.

The program B.v may be compiled separately through the same processing steps as described for A.v above and shown in the illustration of FIG. 6. Processing of the B.v program yields the bit stream files "B_full.bit" and/or "B_part.bit" via Bitgen program 60. Also, in the present embodiment, the B_part.bit file will include the B connect programming information of the design B.v.

The FPGA may then be programmed with the bit stream files generated from the foregoing described compilations in connection with the illustration of FIG. 6. For example, the FPGA may be partially reconfigured with the bit stream file "A_-part.bit" which renders the left hand columns 1-12 programmed with design A.v including the A connect portion programmed into columns 9-12 as illustrated in FIG. 4, for example. The FPGA may be also partially reconfigured with the partial bit stream file "B_part.bit" rendering the right hand columns 13-24 programmed with design B.v including the B connect portion programmed into columns 13-16 as illustrated in FIG. 5, for example. Thus, as the designs A.v and B.v change or different variants thereof are desired, they may be individually programmed into the FPGA even with different interdesign routing configurations in accordance with the foregoing described embodiment.

Figure 7:
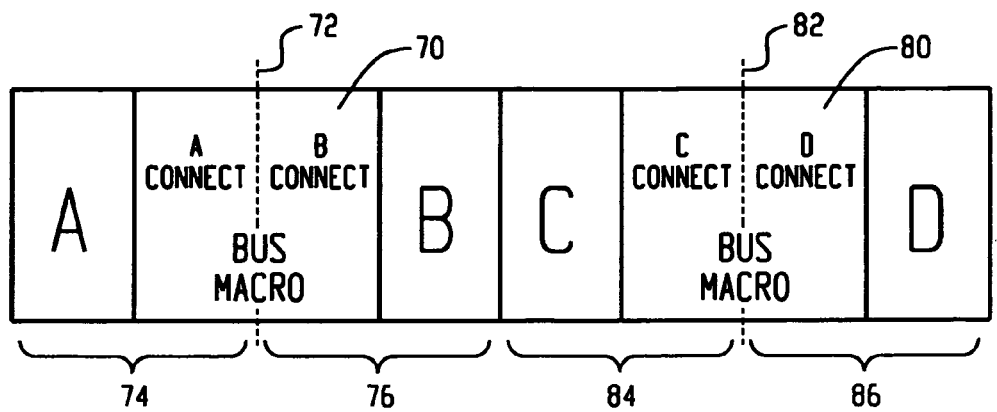
FIG. 7 is an illustration of an FPGA embodiment configured with two pairs of designs with each design pair utilizing a different bus macro.

Also, an FPGA may have more than two designs, like designs A and B and designs C and D, for example, programmed into respective areas of CLB columns, where designs A and B have interdesign routing signals and designs C and D have interdesign routing signals. In this example which is shown by the illustration of FIG. 7, each design A and B would have a separate and independent Verilog level program design with respective A connect and B connect programming embedded in each utilizing one or more TBUF bus rows of a bus macro 70 as the interdesign routing between designs A and B may dictate. Note, that since the TBUF bus rows of the present embodiment are horizontal with respect to the vertical CLB columns and centered substantially about a center line 72, the A design may be programmed for placement in an area 74 of CLB columns of the FPGA and the B design may be programmed for placement in an area 76 of CLB columns of the FPGA, thus rendering the A and B designs interconnected to each other through bus macro 70 within the FPGA such as shown by the illustration of FIG. 7, for example. In this example, the TBUF bus row(s) designated for the bus macro 70 to be utilized by the A connect and B connect configurations of designs A and B, respectively, would be centered substantially about the center line 72 between the areas 74 and 76 of designs A and B, respectively.

Likewise, as shown in the illustration of FIG. 7, each design C and D would have a separate and independent Verilog level program design with respective C connect and D connect programming embedded in each utilizing one or more TBUF bus rows of a different bus macro 80 as the interdesign routing between designs C and D may dictate. Note, that since the TBUF bus rows of the bus macro 80 are horizontal with respect to the vertical CLB columns, the C design may be programmed for placement in an area 84 of CLB columns of the FPGA and the D design may be programmed for placement in an area 86 of CLB columns of the FPGA, thus rendering the C and D designs interconnected to each other through the bus macro 80 within the FPGA such as shown by the illustration of FIG. 7, for example. In this example, the TBUF bus row(s) designated for the bus macro 80 to be utilized by the C connect and D connect configurations of designs A and B, respectively, would be centered substantially about a center line 82 between the areas 84 and 86 of designs C and D, respectively. In this manner, all of the designs A, B, C and D and their respective variants may be loaded into the FPGA by partial reconfiguration while maintaining the integrity of the interdesign routing therebetween.

Figure 8:
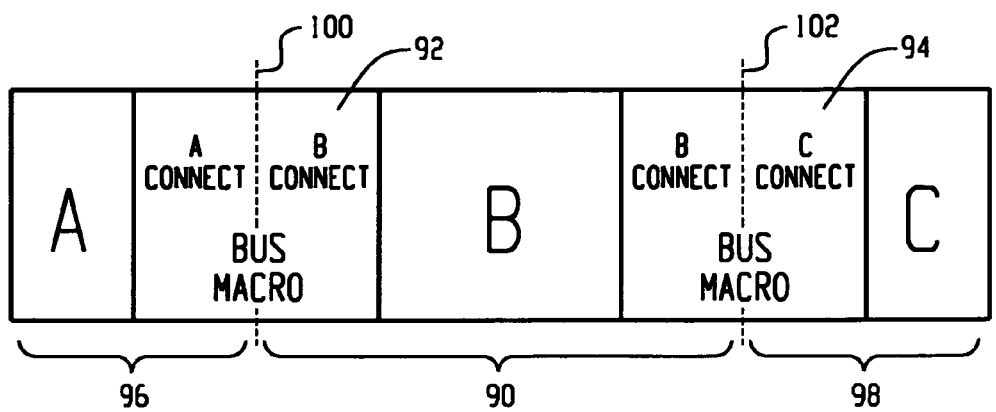
FIG. 8 is an illustration of an FPGA embodiment configured with one design having interdesign routing connections to two other designs utilizing a different bus macro for each interdesign routing connection.

It is also possible for one design, like the B design to have interdesign routing to more than one other design, like designs A and C, as shown by the illustration of FIG. 8, for example. In this scenario, the design B may be programmed for placement in the middle area 90 of CLB columns of the FPGA and include in the program both a B connect portion utilizing a bus macro 92 for the interdesign routing with the A design and a B connect portion for the interdesign routing with the C design using a different bus macro 94 as illustrated in FIG. 8, for example. In this example, the A design may be programmed for placement in an area 96 of CLB columns of the FPGA to the left of the area 90 of the B design, thus rendering the A design and the B design interconnected to each other through the bus macro 92 within the FPGA such as shown by the illustration of FIG. 8. Likewise, the C design may be programmed for placement in an area 98 of CLB columns of the FPGA to the right of the area 90 of the B design, thus rendering the C design and the B design interconnected to each other through the bus macro 94 within the FPGA such as shown by the illustration of FIG. 8, for example.

Moreover, the TBUF bus row(s) designated for the bus macro 92 to be utilized by the A connect and B connect configurations of designs A and B, respectively, may be centered substantially about a center line 100 between the areas 96 and 90 of design A and design B, respectively. Similarly, the TBUF bus row(s) designated for the bus macro 94 to be utilized by the C connect and B connect configurations of designs C and B, respectively, may be centered substantially about a center line 102 between the areas 98 and 90 of design C and design B, respectively. Accordingly, the A connect portion for interdesign routing using bus macro 92 for the A design may be programmed within the top level design program of A design for placement in the CLB columns of area 96 closest to the area 90 of B design and the C connect portion for interdesign routing using bus macro 94 for the C design may be programmed within the top level design program of the C design for placement in the CLB columns of area 98 closest to the area 90 of the B design. In this manner, all of the designs A, B, and C and their respective variants may be loaded into the FPGA by partial reconfiguration while maintaining the integrity of the interdesign routing therebetween.

It is further understood that designs of any combination of the foregoing described examples may also be programmed in the manner described utilizing designated bus macros, soft or hard, and loaded into an FPGA by partial reconfiguration without deviating from the principles of the present invention.

While the present invention has been described herein above in connection with a number of embodiments by way of example, it is understood that in no way, shape or form should the present invention be limited to any of these exemplary embodiments. Rather, the present invention should be construed in breadth and broad scope in accordance with the recitation of the appended claims hereto.

APPENDIX I

```
/ ****************************************************** \
*                                                        *
*    Module      : designA.v                              *
*                                                        *
*    Description : Design using Bus Macro instantiation.  *
*    Design is intended to be placed and routed on the left *
*    half of a Xilinx Virtex V50 device.                  *
*                                                        *
*    The basic function of A allows a 4-bit incrementer   *
*    to be either loaded from off-chip, loaded from the   *
*    B (right-side) design, or simply incremented.        *
*                                                        *
\ ****************************************************** /
'timescale 1ns / 10ps
module designA (clockA_in, loadA, loadB, triA, data_inA,
data_outA);
input clockA_in, loadA, loadB, triA;
input [3:0] data_inA;
output [3:0] data_outA;
wire [3:0] tribusA;
wire clockA_buf;
wire [3:0] data_inB, tribusB;
wire [3:0] data_outB;
reg [3:0] counter;
assign tribusA = { triA, triA, triA, triA };
assign data_inB = 4'b1111;
assign tribusB = 4'b1111;
IBUFG ibufgA (.I(clockA_in), .O(clockA_buf));
BUFG bufgA (.I(clockA_buf), .O(clockA));
always @(posedge clockA)
    if (loadA) counter <= data_inA;
    else if (loadB) counter <= data_outB;
    else counter <= counter + 1;
busmacro bus4bit (.LI_(data_inA), .LT_(tribusA), .O_(dataO),
             .RI_(data_inB), .RT_(tribusB) );
assign data_outA = dataO;
endmodule
//
// Module busmacro is defined as a black box, to prevent
// trimming, and allow pre-built primitive to be recognized.
//
module busmacro (LI_, LT_, O_, RI_, RT_) /* synthesis
```

APPENDIX I-continued

```
syn_black_box */;
input [3:0] LL_, LT_, RI_, RT_;
output [3:0] O_;
endmodule
```

APPENDIX II

```
/ ****************************************************** \
*                                                        *
*   Module      : designB.v                              *
*                                                        *
*   Description : Design using Bus Macro instantiation.  *
*   Design is intended to be placed and routed on the right *
*   half of a Xilinx Virtex V50 device.                  *
*                                                        *
*   The basic function of B allows a 4-bit decrementer   *
*   to be either loaded from off-chip, loaded from the   *
*   A (left-side) design, or simply decremented.         *
*                                                        *
\ ****************************************************** /
'timescale 1ns / 10ps
module designB (clockB_in, loadB, loadA, triB, data_inB,
        data_outB);
input clockB_in, loadB, loadA, triB;
input [3:0] data_inB;
output [3:0] data_outB;
wire [3:0] tribusB;
wire clockB_buf;
wire [3:0] data_inA, tribusA;
wire [3:0] data_outA;
reg [3:0] counter;
assign tribusB = { triB, triB, triB, triB };
assign data_inA = 4'b1111;
assign tribusA = 4'b1111;
IBUFG ibufgB (.I(clockB_in), .O(clockB_buf));
BUFG bufgB (.I(clockB_buf), .O(clockB));
always @(posedge clockB)
    if (loadB) counter <= data_inB;
    else if (loadA) counter <= data_outA;
    else counter <= counter - 1;
busmacro bus4bit (.LI_(data_inA), .LT_(tribusA), .O_(dataO),
        .RI_(data_inB), .RT_(tribusB) );
assign data_outB = dataO;
endmodule
//
// Module busmacro is defined as a black box, to prevent
// trimming, and allow pre-built primitive to be recognized.
//
module busmacro (LI_, LT_, O_, RI_, RT_) /* synthesis
syn_black_box */;
input [3:0] LL_, LT_, RI_, RT_;
output [3:0] O_;
endmodule
```

What is claimed is:

1. A method for implementing designs on a programmable gate array, comprising:

generating from first and second designs a first configuration data set that implements the first and second designs in first and second areas of the programmable gate array, respectively, wherein the first and second areas do not overlap, and each of the first and second designs includes a bus macro that defines a bus interface between the first and second designs, the bus interface including a set of signal lines coupled to the first and second designs and logic that controls input and output of signals over the signal lines;

configuring the programmable gate array with the first configuration data set;

generating from a third design a second configuration data set that implements the third design in the first area and that does not implement any version of the second design;

wherein the third design is different from the first design and includes the bus macro for coupling the third design to the second design with the set of signal lines; and partially reconfiguring the programmable gate array with the second configuration data set in the first area, wherein in the partially reconfigured programmable gate array, the third design implemented with the second configuration data set in the first area is coupled to the set of signal lines.

2. The method of claim 1, wherein generating the first configuration data set includes constraining each bus interface to a particular set of signal lines of the programmable gate array.

3. The method of claim 1, wherein the bus macro in the first design includes a first set of control gates, each control gate having an input coupled to a respective output signal line in the first design and having an output coupled to a respective signal line of the bus interface and adapted to pass the output signal to the signal line responsive to an enable signal from the first design.

4. The method of claim 3, wherein the bus macro in the second design includes a second set of control gates, each control gate having an input coupled to a respective output signal line in the second design and having an output coupled to a respective signal line of the bus interface and adapted to pass the output signal from the second design to the signal line responsive to an enable signal from the second design.

5. The method of claim 1, wherein the steps are performed in the order recited.

6. An apparatus for implementing designs on a programmable gate array, comprising:

means for generating from first and second designs a first configuration data set that implements the first and second designs in first and second areas of the programmable gate array, respectively, wherein the first and second areas do not overlap, and each of the first and second designs includes a bus macro that defines a bus interface between the first and second designs, the bus interface including a set of signal lines coupled to the first and second designs and logic that controls input and output of signals over the signal lines;

means for configuring the programmable gate array with the first configuration data set;

means for generating from a third design a second configuration data set that implements the third design in the first area and that does not implement any version of the second design;

wherein the third design is different from the first design and includes the bus macro for coupling the third design to the second design with the set of signal lines; and means for partially reconfiguring the programmable gate array with the second configuration data set in the first area;

wherein in the partially reconfigured programmable gate array, the third design implemented with the second configuration data set in the first area is coupled to the set of signal lines that route signals from or to the second design in the second area.

* * * * *

UNITED STATES PATENT AND TRADEMARK OFFICE
CERTIFICATE OF CORRECTION

PATENT NO. : 7,669,163 B1  Page 1 of 1
APPLICATION NO. : 11/338360
DATED : February 23, 2010
INVENTOR(S) : Camilleri et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 565 days.

Signed and Sealed this

Twenty-eighth Day of December, 2010

David J. Kappos
*Director of the United States Patent and Trademark Office*